(12) United States Patent
Kao

(10) Patent No.: US 8,476,968 B2
(45) Date of Patent: Jul. 2, 2013

(54) FILTER SYSTEM CAPABLE OF AUTOMATICALLY ADJUSTING BANDWIDTH AND METHOD OF AUTOMATICALLY ADJUSTING BANDWIDTH OF A FILTER

(75) Inventor: Ping-Hung Kao, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 13/366,382

(22) Filed: Feb. 6, 2012

(65) Prior Publication Data
US 2013/0049849 A1    Feb. 28, 2013

(30) Foreign Application Priority Data
Aug. 30, 2011    (TW) .............................. 100131072 A

(51) Int. Cl.
*H03B 1/00*    (2006.01)

(52) U.S. Cl.
USPC .......................................................... 327/551

(58) Field of Classification Search
USPC .................. 327/551–553, 556–559
See application file for complete search history.

(56) References Cited

U.S. PATENT DOCUMENTS
2002/0027958 A1*    3/2002    Kolanek ........................ 375/297

* cited by examiner

*Primary Examiner* — Lincoln Donovan
*Assistant Examiner* — Sibin Chen
(74) *Attorney, Agent, or Firm* — Winston Hsu; Scott Margo

(57) ABSTRACT

A filter system capable of automatically adjusting bandwidth includes a filter and an adaptive unit. The filter is used for filtering a digital signal to generate an output signal to an application unit. The adaptive unit is used for generating an adjustment signal to the filter according to the digital signal and the output signal. The filter dynamically adjusts bandwidth of the filter according to the adjustment signal.

24 Claims, 5 Drawing Sheets

FILTER SYSTEM CAPABLE OF AUTOMATICALLY ADJUSTING BANDWIDTH AND METHOD OF AUTOMATICALLY ADJUSTING BANDWIDTH OF A FILTER

BACKGROUND OF THE INVENTION

1. Field of the Invention

The present invention is related to a filter system capable of automatically adjusting bandwidth and a method of automatically adjusting bandwidth of a filter, and particularly to a filter system capable of automatically adjusting bandwidth and a method of automatically adjusting bandwidth of a filter that can utilize an adaptive unit to control the filter for dynamically adjusting the bandwidth of the filter according to a usage mode and/or a surrounding environment of a gravity sensor.

2. Description of the Prior Art

General speaking, for a filter coupled to a gravity sensor of a micro electro-mechanical system (MEMS) circuit, noise of the gravity sensor is generated mainly from the MEMS circuit (such as Brownian motion), analog circuits coupled to the gravity sensor (such as thermal noise, or capacitor coupling noise), and a surrounding environment of the gravity sensor (such as vibration of a user, or mechanical structure for fixing the gravity sensor).

In addition, the user not only considers trade-off between bandwidth of the filter (cut-off frequency) and response time, but also considers different cut-off frequencies corresponding to different applications for gravity and tilt detection. However, in the prior art, the filter can not automatically adjust the bandwidth of the filter (that is, the cut-off frequency of the filter) according to the above mentioned problems. That is to say, in the prior art, the bandwidth of the filter can not be changed properly for the different applications.

SUMMARY OF THE INVENTION

An embodiment provides a filter system capable of automatically adjusting bandwidth. The filter system includes a filter and an adaptive unit. The filter is used for filtering a digital signal to generate an output signal to an application unit. The adaptive unit is used for generating an adjustment signal to the filter according to the digital signal and the output signal. The filter dynamically adjusts bandwidth of the filter according to the adjustment signal.

Another embodiment provides a method of automatically adjusting bandwidth of a filter. The method includes a filter filtering a digital signal to generate an output signal to an application unit; generating an adjustment signal to the filter according to the digital signal and the output signal; and the filter dynamically adjusting bandwidth of the filter according to the adjustment signal.

The present invention provides a filter system capable of automatically adjusting bandwidth and a method of automatically adjusting bandwidth of a filter. The filter system and the method utilize an adaptive unit to determine a surrounding environment and/or a usage mode of a gravity sensor according to a digital signal generated by an analog/digital converter, and to generate an adjustment signal to the filter according to the digital signal, an output signal, the surrounding environment of the gravity sensor, and/or the usage mode of the gravity sensor. Then, the filter can dynamically adjust the bandwidth of the filter according to the adjustment signal to filter noise generated by the gravity sensor. Therefore, in the present invention, the filter can not only dynamically adjust the bandwidth of the filter properly according to the adjustment signal, but operation burden of the adaptive unit can also be reduced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
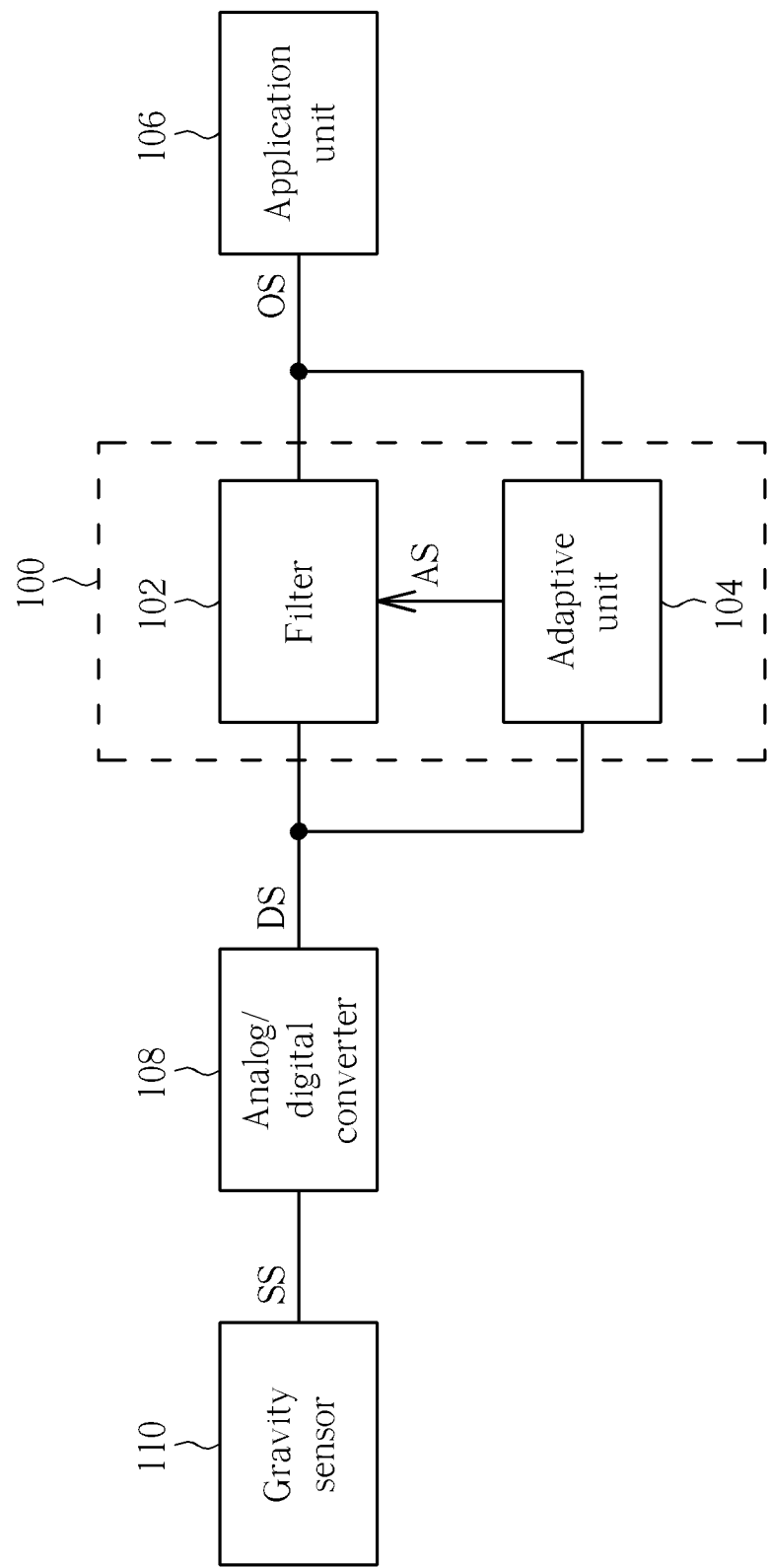
FIG. 1 is a diagram illustrating a filter system capable of automatically adjusting bandwidth according to an embodiment.

Please refer to FIG. 1. FIG. 1 is a diagram illustrating a filter system 100 capable of automatically adjusting bandwidth according to an embodiment. The filter system 100 includes a filter 102 and an adaptive unit 104. The filter 102 is used for filtering a digital signal DS to generate an output signal OS to an application unit 106, where an analog/digital converter 108 is used for converting a sensing signal SS generated by a gravity sensor 110 into the digital signal DS, and the application unit 106 is a hardware application unit or a software application unit. The adaptive unit 104 is used for generating an adjustment signal AS to the filter 102 according to the digital signal DS and the output signal OS, where the filter 102 can dynamically adjust a programmable cut-off frequency (bandwidth of the filter 102) of the filter 102 according to the adjustment signal AS. In addition, in another embodiment of the present invention, the filter system 100 further includes the analog/digital converter 108 and the gravity sensor 110.

Figure 2:
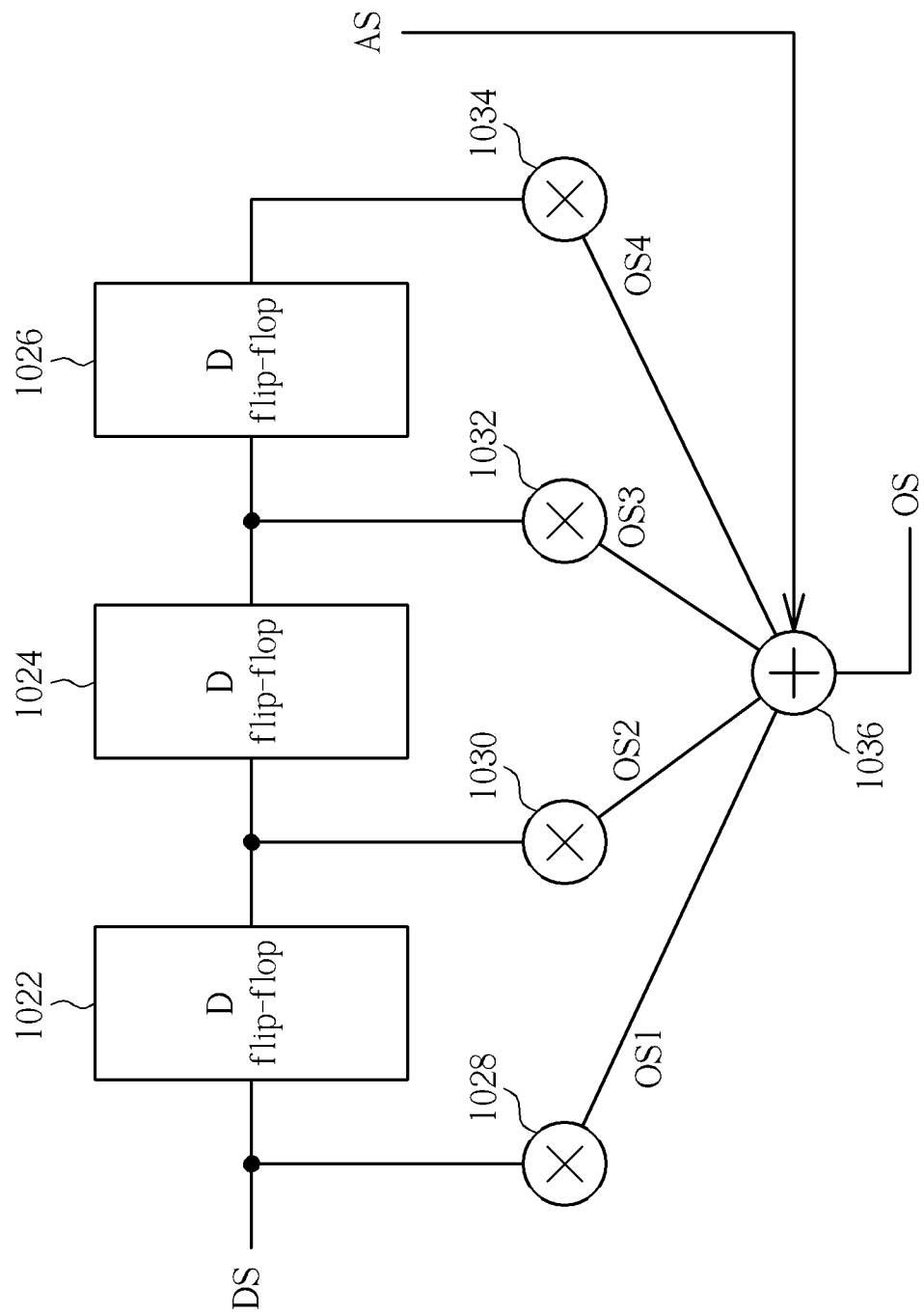
FIG. 2 is a diagram illustrating the filter.

Please refer to FIG. 2. FIG. 2 is a diagram illustrating the filter 102. As shown in FIG. 2, the filter 102 includes 3 D flip-flops 1022, 1024, 1026, 4 multipliers 1028, 1030, 1032, 1034, and an adder 1036. But, the present invention is not limited to the 3 D flip-flops 1022, 1024, 1026 and the 4 multipliers 1028, 1030, 1032, 1034. An input terminal of the D flip-flop 1022 is used for receiving the digital signal DS, an output terminal of the D flip-flop 1022 is coupled to an input terminal of the D flip-flop 1024, an output terminal of the D flip-flop 1024 is coupled to an input terminal of the D flip-flop 1026, and an output terminal of the D flip-flop 1026 is coupled to an input terminal of the multiplier 1034. An input terminal of the multiplier 1028 is coupled to the input terminal of the D flip-flop 1022, an input terminal of the multiplier 1030 is coupled to the input terminal of the D flip-flop 1024, and an input terminal of the multiplier 1032 is coupled to the input terminal of the D flip-flop 1026. The adder 1036 is coupled to output terminals of the multiplier 1028, 1030, 1032, 1034 and the adaptive unit 104 for receiving the adjustment signal AS and output signals OS1, OS2, OS3, OS4 of the output terminals of the multipliers 1028, 1030, 1032, 1034, and outputting the output signal OS according to the adjustment signal AS and the output signals OS1, OS2, OS3, OS4 of the output terminals of the multipliers 1028, 1030, 1032, 1034. In addition, the adder 1036 can adjust the programmable cut-off frequency of the filter 102 according to the adjustment signal AS.

When the gravity sensor 110 powers on and after the gravity sensor 110 powers on, the adaptive unit 104 can determine a surrounding environment of the gravity sensor 110 according to a digital signal DS, and generate an adjustment signal AS to the filter 102 according to the surrounding environment of the gravity sensor 110, the digital signal DS, and an output signal OS. The adaptive unit 104 can determine bandwidth of the filter 102 according to the surrounding environment of the gravity sensor 110 to reduce operation burden of the adaptive unit 104. That is to say, the adaptive unit 104 can determine and record the surrounding environment of the gravity sensor 110 according to the digital signal DS, and generate the adjustment signal AS to the filter 102 according to a noise model generated by the surrounding environment of the gravity sensor 110. The filter 102 can adjust the bandwidth of the filter 102 (that is, the filter 102 adjusts a programmable cut-off frequency of the filter 102) according to the adjustment signal AS to filter noise generated by the surrounding environment of the gravity sensor 110. For example, when the gravity sensor 110 is located on a vehicle, the adaptive unit 104 can generate an adjustment signal AS to the filter 102 according to a noise model generated by vibration of the vehicle. The filter 102 can adjust bandwidth of the filter 102 according to the adjustment signal AS to filter noise generated by the vibration of the vehicle. Therefore, when the gravity sensor 110 powers on and after the gravity sensor 110 powers on, the adaptive unit 104 continuously determines and records the surrounding environment of the gravity sensor 110 according to the digital signal DS. Thus, the filter 102 can not only adjust the bandwidth of the filter 102 properly according to the adjustment signal AS, but the operation burden of the adaptive unit 104 can also be reduced.

In addition, when the gravity sensor 110 powers on and after the gravity sensor 110 powers on, the adaptive unit 104 can determine a usage mode of the gravity sensor 110 according to a digital signal DS, and generate an adjustment signal AS to the filter 102 according to the usage mode of the gravity sensor 110, the digital signal DS, and an output signal OS. The adaptive unit 104 can determine bandwidth of the filter 102 according to the usage mode of the gravity sensor 110 to reduce operation burden of the adaptive unit 104. That is to say, the adaptive unit 104 can determine and record the usage mode of the gravity sensor 110 according to the digital signal DS, and generate the adjustment signal AS to the filter 102 according to a noise model generated by the usage mode of the gravity sensor 110. The filter 102 can adjust the bandwidth of the filter 102 according to the adjustment signal AS to filter noise generated by the gravity sensor 110 according to the usage mode of the gravity sensor 110. For example, when the gravity sensor 110 is applied to a joystick of a game, the adaptive unit 104 can generate an adjustment signal AS to the filter 102 according to a usage mode of the joystick of the game, so the filter 102 can increase bandwidth of the filter 102 according to the adjustment signal AS; when the gravity sensor 110 is applied to a digital photo frame, the adaptive unit 104 can generate an adjustment signal AS to the filter 102 according to a usage mode of the digital photo frame, so the filter 102 can decrease bandwidth of the filter 102 according to adjustment signal AS. Therefore, when the gravity sensor 110 powers on and after the gravity sensor 110 powers on, the adaptive unit 104 continuously determines and records the usage mode of the gravity sensor 110 according to the digital signal DS. Thus, the filter 102 can not only adjust the bandwidth of the filter 102 properly according to the adjustment signal AS, but the operation burden of the adaptive unit 104 can also be reduced.

In addition, when the gravity sensor 110 powers on and after the gravity sensor 110 powers on, the adaptive unit 104 can simultaneously determine a usage mode and a surrounding environment of the gravity sensor 110 according to a digital signal DS, and generate an adjustment signal AS to the filter 102 according to the usage mode and the surrounding environment of the gravity sensor 110, the digital signal DS, and an output signal OS. The filter 102 can adjust bandwidth of the filter 102 according to the adjustment signal AS to filter noise generated by the gravity sensor 110 according to the usage mode and the surrounding environment of the gravity sensor 110.

Figure 3:
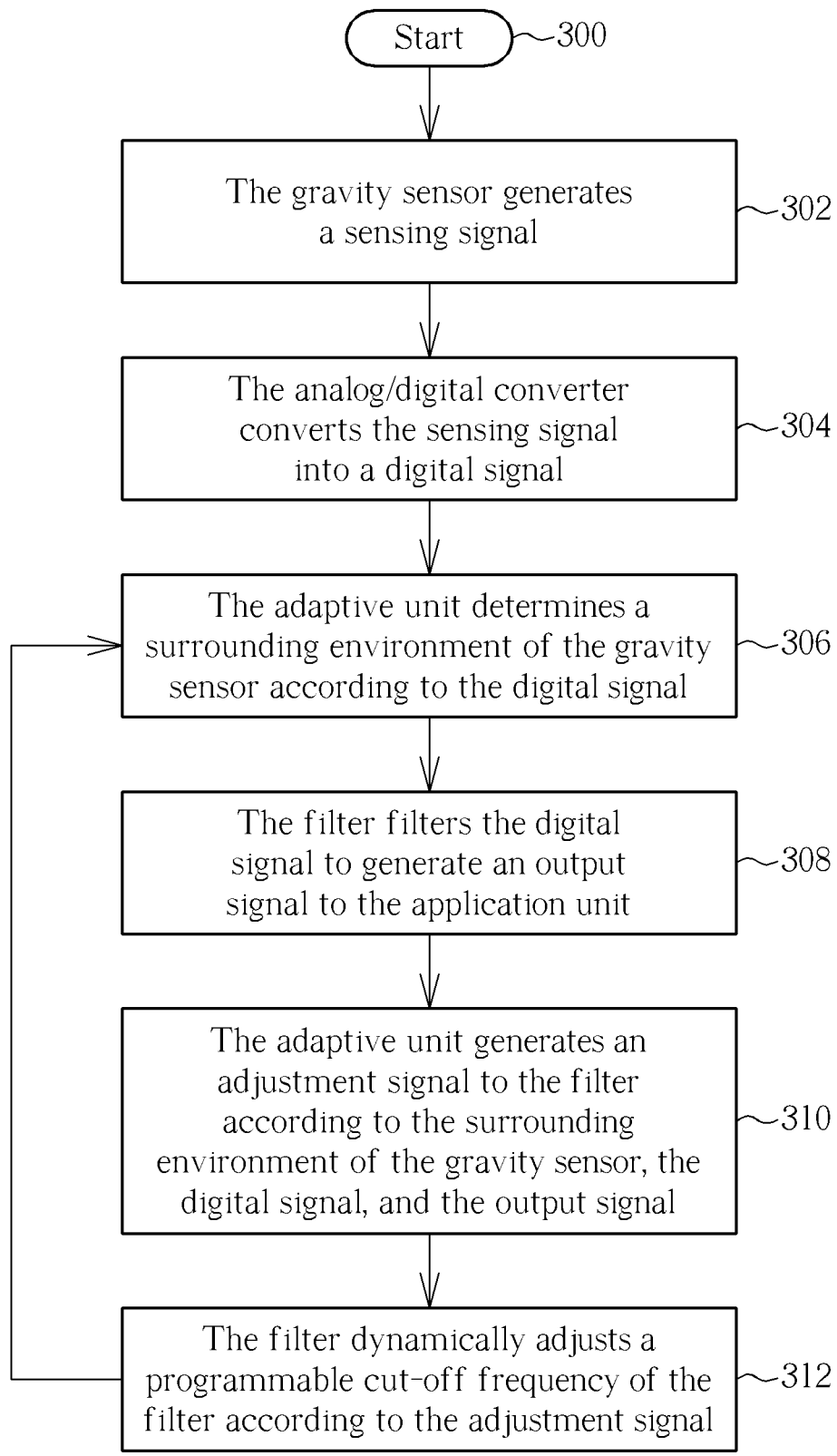
FIG. 3 is a flowchart illustrating a method of automatically adjusting bandwidth of a filter according to another embodiment.

Please refer to FIG. 3. FIG. 3 is a flowchart illustrating a method of automatically adjusting bandwidth of a filter according to another embodiment. The method in FIG. 3 is illustrated using the filter system 100 in FIG. 1. Detailed steps are as follows:

Step 300: Start.

Step 302: The gravity sensor 110 generates a sensing signal SS.

Step 304: The analog/digital converter 108 converts the sensing signal SS into a digital signal DS.

Step 306: The adaptive unit 104 determines a surrounding environment of the gravity sensor 110 according to the digital signal DS.

Step 308: The filter 102 filters the digital signal DS to generate an output signal OS to the application unit 106.

Step 310: The adaptive unit 104 generates an adjustment signal AS to the filter 102 according to the surrounding environment of the gravity sensor 110, the digital signal DS, and the output signal OS.

Step 312: The filter 102 dynamically adjusts a programmable cut-off frequency of the filter 102 according to the adjustment signal AS; go to Step 306.

In Step 306, the adaptive unit 104 can determine and record the surrounding environment of the gravity sensor 110 according to the digital signal DS, and generate the adjustment signal AS to the filter 102 according to a noise model generated by the surrounding environment of the gravity sensor 110. In Step 312, the filter 102 can adjust the bandwidth of the filter 102 (that is, the filter 102 can adjust the programmable cut-off frequency of the filter 102) according to the adjustment signal AS to filter noise generated by the surrounding environment of the gravity sensor 110.

Figure 4:
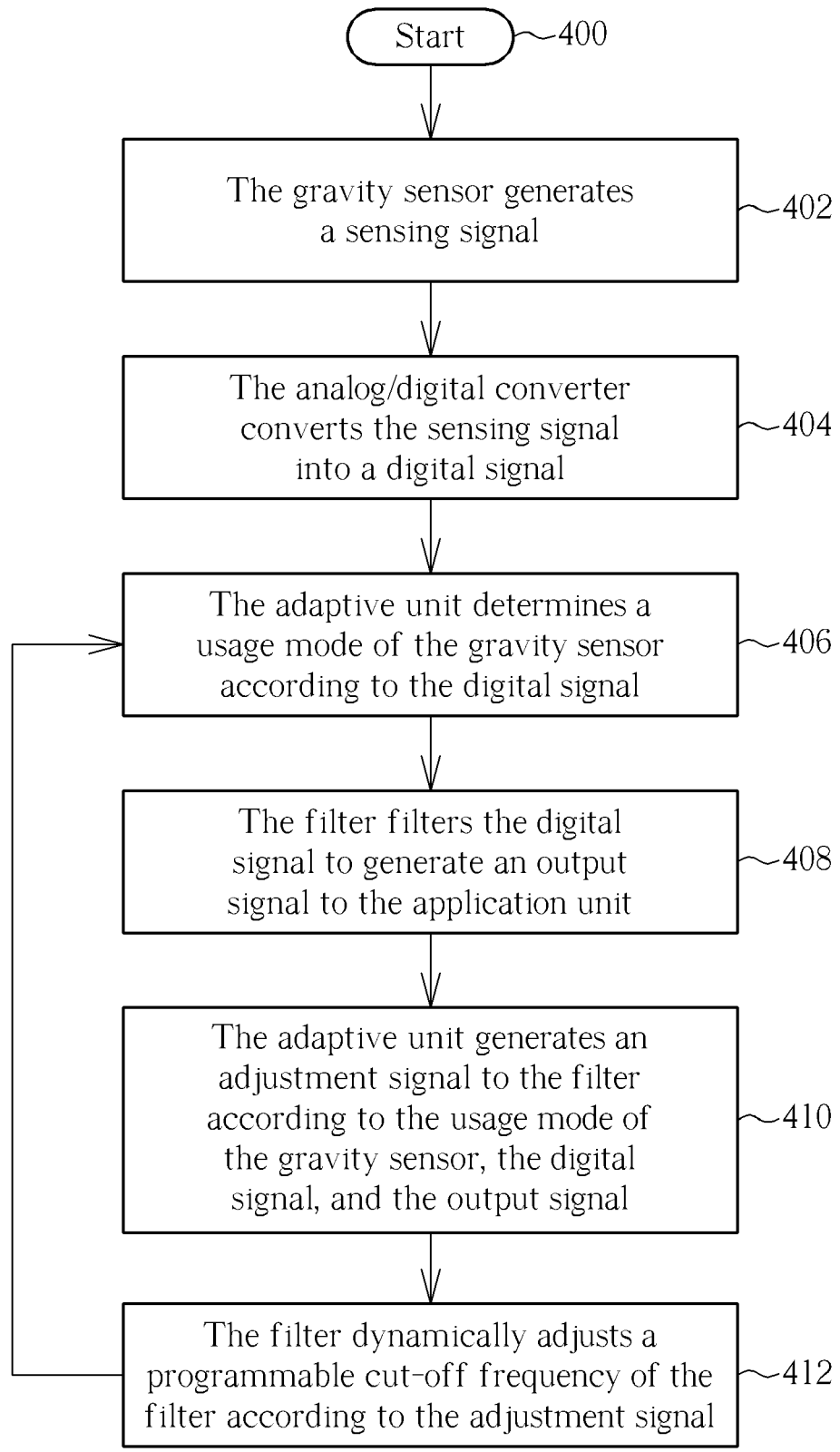
FIG. 4 is a flowchart illustrating a method of automatically adjusting bandwidth of a filter according to another embodiment.

Please refer to FIG. 4. FIG. 4 is a flowchart illustrating a method of automatically adjusting bandwidth of a filter according to another embodiment. The method in FIG. 4 is illustrated using the filter system 100 in FIG. 1. Detailed steps are as follows:

Step 400: Start.

Step 402: The gravity sensor 110 generates a sensing signal SS.

Step 404: The analog/digital converter 108 converts the sensing signal SS into a digital signal DS.

Step 406: The adaptive unit 104 determines a usage mode of the gravity sensor 110 according to the digital signal DS.

Step 408: The filter 102 filters the digital signal DS to generate an output signal OS to the application unit 106.

Step 410: The adaptive unit 104 generates an adjustment signal AS to the filter 102 according to the usage mode of the gravity sensor 110, the digital signal DS, and the output signal OS.

Step 412: The filter 102 dynamically adjusts a programmable cut-off frequency of the filter 102 according to the adjustment signal AS; go to Step 406.

In Step 406, the adaptive unit 104 can determine and record the usage mode of the gravity sensor 110 according to the digital signal DS, and generate the adjustment signal AS to the filter 102 according to a noise model generated by the usage mode of the gravity sensor 110. When the usage mode of the gravity sensor 110 is a violent movement mode (such as, the gravity sensor 110 is applied to a joystick of a game), the adaptive unit 104 can generate the adjustment signal AS to the filter 102 according to a usage mode of the joystick of the game, so the filter 102 can increase the bandwidth of the filter 102 according to the adjustment signal AS; when the usage mode of the gravity sensor 110 is a slight movement mode (such as, the gravity sensor 110 is applied to a digital photo frame), the adaptive unit 104 can generate the adjustment signal AS to the filter 102 according to a usage mode of the digital photo frame, so the filter 102 can decrease the bandwidth of the filter 102 according to adjustment signal AS. In Step 412, the filter 102 can adjust the bandwidth of the filter 102 (that is, the filter 102 can adjust the programmable cut-off frequency of the filter 102) according to the adjustment signal AS to filter noise generated by the usage mode of the gravity sensor 110.

Figure 5:
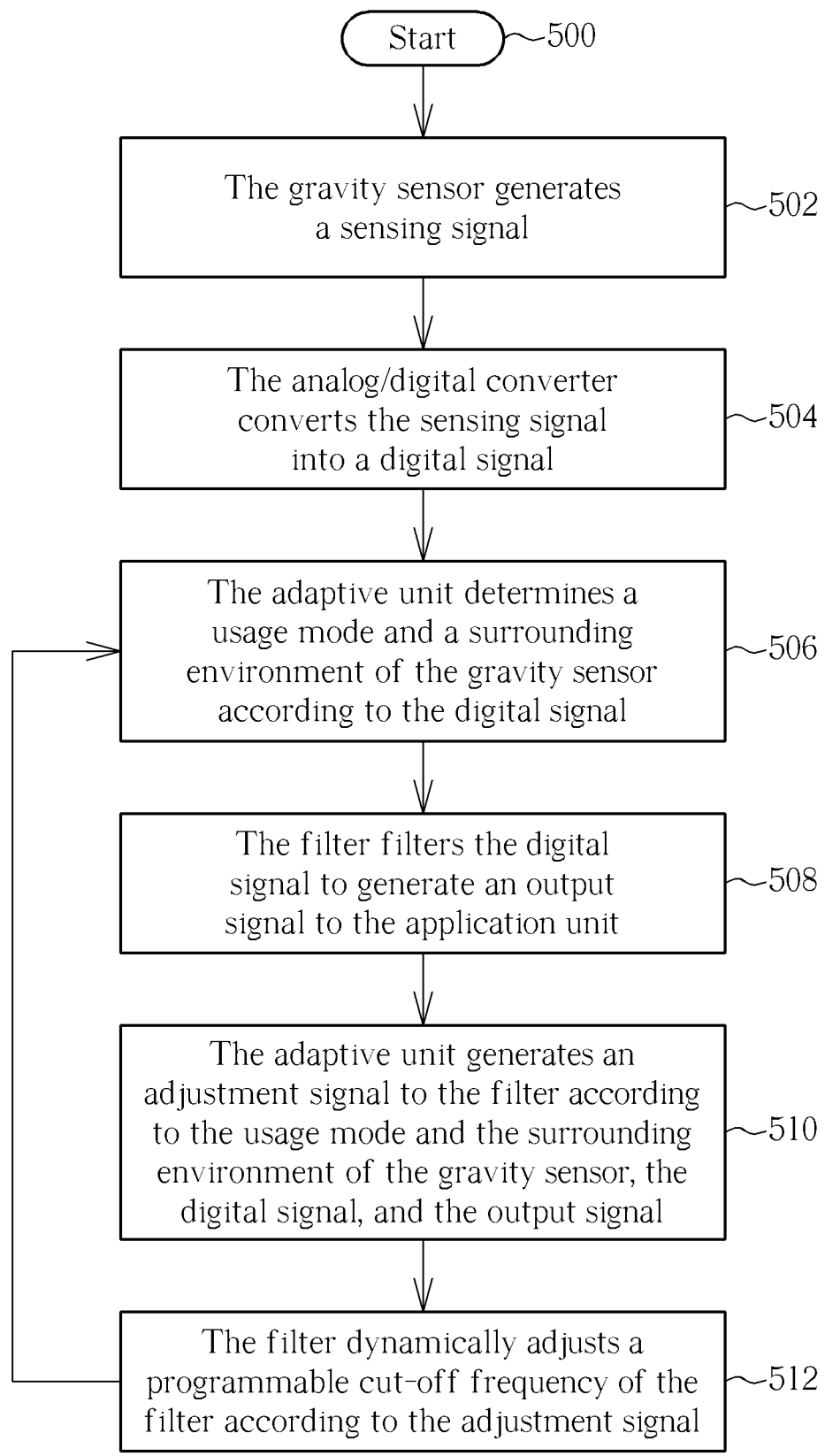
FIG. 5 is a flowchart illustrating a method of automatically adjusting bandwidth of a filter according to another embodiment.

Please refer to FIG. 5. FIG. 5 is a flowchart illustrating a method of automatically adjusting bandwidth of a filter according to another embodiment. The method in FIG. 5 is illustrated using the filter system 100 in FIG. 1. Detailed steps are as follows:

Step 500: Start.

Step 502: The gravity sensor 110 generates a sensing signal SS.

Step 504: The analog/digital converter 108 converts the sensing signal SS into a digital signal DS.

Step 506: The adaptive unit 104 determines a usage mode and a surrounding environment of the gravity sensor 110 according to the digital signal DS.

Step 508: The filter 102 filters the digital signal DS to generate an output signal OS to the application unit 106.

Step 510: The adaptive unit 104 generates an adjustment signal AS to the filter 102 according to the usage mode and the surrounding environment of the gravity sensor 110, the digital signal DS, and the output signal OS.

Step 512: The filter 102 dynamically adjusts a programmable cut-off frequency of the filter 102 according to the adjustment signal AS; go to Step 506.

A difference between the embodiment in FIG. 5 and the embodiment in FIG. 4 is that in Step 506, the adaptive unit 104 can simultaneously determine and record the usage mode and the surrounding environment of the gravity sensor 110 according to the digital signal DS, and generate the adjustment signal AS to the filter 102 according to a noise model generated by the surrounding environment and the usage mode of the gravity sensor 110; in Step 510, the adaptive unit 104 generates the adjustment signal AS to the filter 102 according to the usage mode and the surrounding environment of the gravity sensor 110, the digital signal DS, and the output signal OS. Further, subsequent operational principles of the embodiment in FIG. 5 are the same as those of the embodiment in FIG. 4, so further description thereof is omitted for simplicity.

To sum up, the filter system capable of automatically adjusting the bandwidth and the method of automatically adjusting the bandwidth of the filter utilize the adaptive unit to determine a surrounding environment and/or a usage mode of the gravity sensor according to a digital signal generated by the analog/digital converter, and to generate an adjustment signal to the filter according to the digital signal, the output signal, the surrounding environment of the gravity sensor, and/or the usage mode of the gravity sensor. Then, the filter can dynamically adjust the bandwidth of the filter according to the adjustment signal to filter noise generated by the gravity sensor. Therefore, in the present invention, the filter can not only dynamically adjust the bandwidth of the filter properly according to the adjustment signal, but operation burden of the adaptive unit 104 can also be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A filter system capable of automatically adjusting bandwidth, the filter system comprising:
   a gravity sensor for generating a sensing signal;
   an analog/digital converter for converting the sensing signal into a digital signal;
   a filter for filtering the digital signal to generate an output signal to an application unit; and
   an adaptive unit for generating an adjustment signal to the filter according to the digital signal and the output signal;
   wherein the filter dynamically adjusts bandwidth of the filter according to the adjustment signal.

2. The filter system of claim 1, wherein the adaptive unit is used for determining a surrounding environment of the gravity sensor according to the digital signal, and generating the adjustment signal to the filter according to the surrounding environment, the digital signal, and the output signal.

3. The filter system of claim 2, wherein the surrounding environment is used for determining the bandwidth of the filter.

4. The filter system of claim 1, wherein the adaptive unit is used for determining a usage mode of the gravity sensor according to the digital signal, and generating the adjustment signal to the filter according to the usage mode, the digital signal, and the output signal.

5. The filter system of claim 4, wherein the usage mode is used for determining the bandwidth of the filter.

6. The filter system of claim 1, wherein the adaptive unit is used for determining a surrounding environment and a usage mode of the gravity sensor according to the digital signal, and generating the adjustment signal to the filter according to the surrounding environment, the usage mode, the digital signal, and the output signal.

7. The filter system of claim 6, wherein the surrounding environment is used for determining the bandwidth of the filter.

8. The filter system of claim 6, wherein the usage mode is used for determining the bandwidth of the filter.

9. The filter system of claim 1, wherein the filter comprises:
   N D flip-flops, wherein an input terminal of a first D flip-flop is used for receiving the digital signal;
   N+1 multipliers, wherein an input terminal of an $(N+1)^{th}$ multiplier is coupled to an output terminal of an $N^{th}$ D flip-flop, and an input terminal of each multiplier of other multipliers of the N+1 multipliers is coupled to an input terminal of a corresponding D flip-flop; and
   an adder coupled to an output terminal of each multiplier of the N+1 multipliers and the adaptive unit for receiving the adjustment signal and an output signal of an output terminal of each multiplier of the N+1 multipliers, and outputting the output signal according to the adjustment signal and an output signal of an output terminal of each multiplier of the N+1 multipliers.

10. The filter system of claim 9, wherein the adder adjusts the bandwidth of the filter according to the adjustment signal.

11. The filter system of claim 1, wherein the application unit is a hardware application unit.

12. The filter system of claim 1, wherein the application unit is a software application unit.

13. A method of automatically adjusting bandwidth of a filter, the method comprising:
   a gravity sensor generating a sensing signal;
   converting the sensing signal into a digital signal;
   a filter filtering the digital signal to generate an output signal to an application unit;
   generating an adjustment signal to the filter according to the digital signal and the output signal; and
   the filter dynamically adjusting bandwidth of the filter according to the adjustment signal.

14. The method of claim 13, further comprising:
   determining a surrounding environment of the gravity sensor according to the digital signal; and
   generating the adjustment signal to the filter according to the surrounding environment, the digital signal, and the output signal.

15. The method of claim 13, further comprising:
   determining a usage mode of the gravity sensor according to the digital signal; and
   generating the adjustment signal to the filter according to the usage mode, the digital signal, and the output signal.

16. The method of claim 15, wherein the usage mode is a violent movement mode.

17. The method of claim 16, wherein the bandwidth of the filter is wider when the usage mode is the violent movement mode.

18. The method of claim 15, wherein the usage mode is a slight movement mode.

19. The method of claim 18, wherein the bandwidth of the filter is narrower when the usage mode is the slight movement mode.

20. The method of claim 13, further comprising:
   determining a surrounding environment and a usage mode of the gravity sensor according to the digital signal; and
   generating the adjustment signal to the filter according to the surrounding environment, the usage mode, the digital signal, and the output signal.

21. The method of claim 20, wherein the usage mode is a violent movement mode.

22. The method of claim 21, wherein the bandwidth of the filter is wider when the usage mode is the violent movement mode.

23. The method of claim 20, wherein the usage mode is a slight movement mode.

24. The method of claim 23, wherein the bandwidth of the filter is narrower when the usage mode is the slight movement mode.

* * * * *